United States Patent
Ferriss et al.

(10) Patent No.: US 9,735,732 B1
(45) Date of Patent: Aug. 15, 2017

(54) COUPLED OSCILLATORS

(71) Applicant: International Business Machines Corporation, Armonk, NY (US)

(72) Inventors: Mark A. Ferriss, Tarrytown, NY (US); Daniel J. Friedman, Sleepy Hollow, NY (US); Wooram Lee, Briarcliff Manor, NY (US); Bodhisatwa Sadhu, Fishkill, NY (US); Alberto Valdes Garcia, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/177,594

(22) Filed: Jun. 9, 2016

(51) Int. Cl.
| | |
|---|---|
| *H03L 7/00* | (2006.01) |
| *H03B 5/12* | (2006.01) |
| *H03B 27/00* | (2006.01) |
| *H03K 3/03* | (2006.01) |

(52) U.S. Cl.
CPC ......... *H03B 5/1265* (2013.01); *H03B 5/1215* (2013.01); *H03B 5/1218* (2013.01); *H03B 27/00* (2013.01); *H03K 3/0315* (2013.01); *H03B 2201/0266* (2013.01)

(58) Field of Classification Search
CPC .... H03B 27/00; H03B 5/1265; H03B 5/1215; H03B 5/1218; H03B 2201/0266; H03K 3/0315
USPC .................................... 331/57, 2, 45, 46, 48
See application file for complete search history.

(56) References Cited

U.S. PATENT DOCUMENTS

| | | | |
|---|---|---|---|
| 6,249,190 B1 | 6/2001 | Rozenblit et al. | |
| 6,327,463 B1 * | 12/2001 | Welland | H03B 21/02 331/36 C |
| 7,005,930 B1 * | 2/2006 | Kim | H03L 7/24 331/117 R |
| 7,215,194 B2 | 5/2007 | Kucharski et al. | |
| (Continued) | | | |

FOREIGN PATENT DOCUMENTS

JP     2005333313 A     12/2005

OTHER PUBLICATIONS

Kang et al., "A 100GHz Active-Varactor VCO and a Bi-directionally Injection-Locked Loop in 65nm CMOS", RMO4C-1, 2013 IEEE Radio Frequency Integrated Circuits Symposium, © 2013 IEEE, 4 pages.

(Continued)

*Primary Examiner* — Arnold Kinkead
(74) *Attorney, Agent, or Firm* — Steven F. McDaniel

(57) ABSTRACT

An apparatus includes an oscillation ring comprising N oscillators, where N is an even integer that is greater than 3, the N oscillators connected in series in a loop by N connection nodes, each oscillator of the N oscillators comprising a pair of cross-coupled inverting amplifiers. The apparatus also includes N inductors arranged in a star configuration such that each inductor of the N inductors connects to a corresponding connection node of the oscillation ring and a common connection node of the star configuration. The apparatus may also include N capacitor banks. Each of the N capacitor banks may include a plurality of activation switches for loading a corresponding oscillator with capacitance. A method includes providing the above apparatus and activating selected activation switches to adjust an oscillation frequency for the oscillation ring toward a desired value.

20 Claims, 6 Drawing Sheets

(56) References Cited

U.S. PATENT DOCUMENTS

| | | | | |
|---|---|---|---|---|
| 7,276,983 B2* | 10/2007 | Kim | ............ | H03B 21/02 |
| | | | | 331/117 R |
| 7,675,371 B2* | 3/2010 | Wood | ............ | G06F 1/10 |
| | | | | 331/107 SL |
| 7,772,933 B1 | 8/2010 | Nicholls | | |
| 2007/0018740 A1* | 1/2007 | Gabara | ............ | G06F 1/10 |
| | | | | 331/167 |
| 2009/0021317 A1 | 1/2009 | Hsieh | | |
| 2011/0298549 A1* | 12/2011 | Luong | ............ | H03B 5/24 |
| | | | | 331/57 |
| 2013/0099870 A1 | 4/2013 | Terrovitis | | |

OTHER PUBLICATIONS

Li et al., "A Low-Phase-Noise Wide-Tuning-Range Oscillator Based on Resonant Mode Switching", IEEE Journal of Solid-State Circuits, vol. 47, No. 6, Jun. 2012, © 2012 IEEE, 14 pages.

Tousi et al., "A Novel CMOS High-Power Terahertz VCO Based on Coupled Oscillators: Theory and Implementation", IEEE Journal of Solid-State Circuits, vol. 47, No. 12, Dec. 2012, © 2012 IEEE, 11 pages.

* cited by examiner

COUPLED OSCILLATORS

STATEMENT REGARDING FEDERALLY SPONSORED RESEARCH OR DEVELOPMENT

This invention was made with United States government support under contract number FA8650-09-C-7924 awarded by the Defense Advanced Research Projects Agency (DARPA). The United States government has certain rights to this invention.

BACKGROUND

The present invention relates generally to oscillators and more particularly to coupled oscillators.

Oscillator phase noise can be improved by coupling multiple (e.g., N) oscillators together. This improvement can be intuitively understood as distributing the noise in each oscillator over N-coupled modes instead of a single mode of oscillation and confining the oscillation signal in the selected mode, which implies the improvement in signal-to-noise ratio by a factor of 10 log N. Another intuitive way to explain such signal-to-noise improvement is as follows. By distributing (and thereby summing) the uncorrelated noise from multiple sources (i.e., oscillators) into each mode, some of the noise is statistically cancelled (due to noise of opposite polarities) resulting in an improvement (e.g., 10 log N) in oscillator phase noise. However, adding oscillators and coupling them to each other in a conventional manner may increase the required circuit area by a factor of N or more.

SUMMARY

An apparatus includes an oscillation ring comprising N oscillators, where N is an even integer that is greater than 3, the N oscillators connected in series in a loop by N connection nodes, each oscillator of the N oscillators comprising a pair of cross-coupled inverting amplifiers. The apparatus also includes N inductors arranged in a star configuration such that each inductor of the N inductors connects to a corresponding connection node of the oscillation ring and a common connection node. The apparatus may also include N capacitor banks. Each of the N capacitor banks may include a plurality of activation switches for loading a corresponding oscillator with different values of capacitance. A method includes providing the above apparatus and activating selected activation switches to adjust an oscillation frequency for the oscillation ring toward a desired value.

DETAILED DESCRIPTION

It should be noted that references throughout this specification to features, advantages, or similar language herein do not imply that all of the features and advantages that may be realized with the embodiments disclosed herein should be, or are in, any single embodiment of the invention. Rather, language referring to the features and advantages is understood to mean that a specific feature, advantage, or characteristic described in connection with an embodiment is included in at least one embodiment of the present invention. Thus, discussion of the features, advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages will become more fully apparent from the following drawings, description and appended claims, or may be learned by the practice of the invention as set forth hereinafter.

Figure 1:
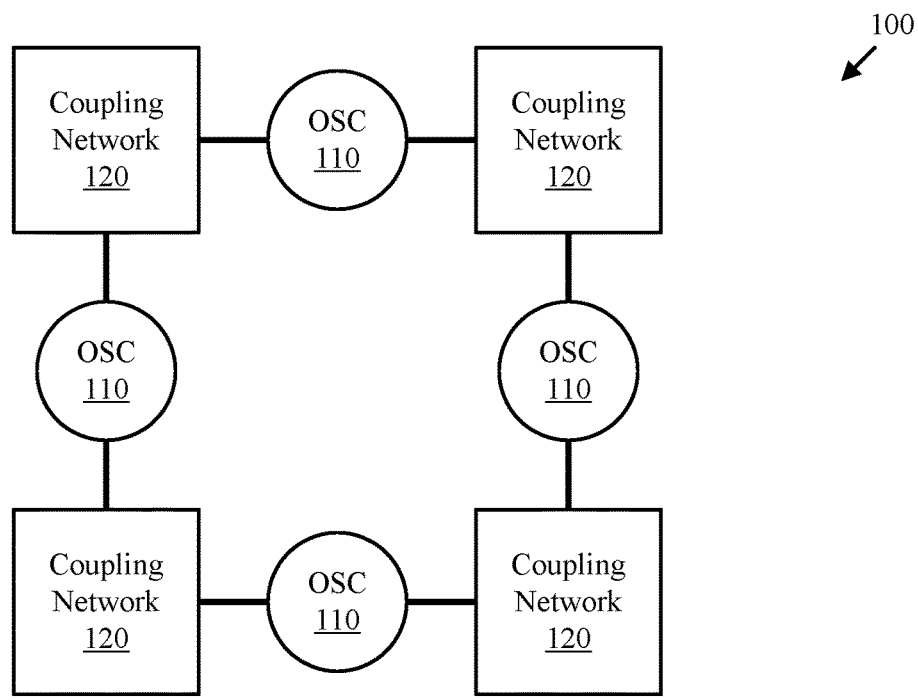
FIG. 1 is a block diagram depicting an oscillation ring in accordance with at least one embodiment of the present invention.

The embodiments disclosed herein recognize that oscillator phase noise can be improved by coupling multiple (e.g., N) oscillators together into an oscillation ring. For example, FIG. 1 depicts one example of an oscillation ring 100 with multiple oscillators 110 connected in a ring and coupled via one or more coupling networks 120.

Figure 2:
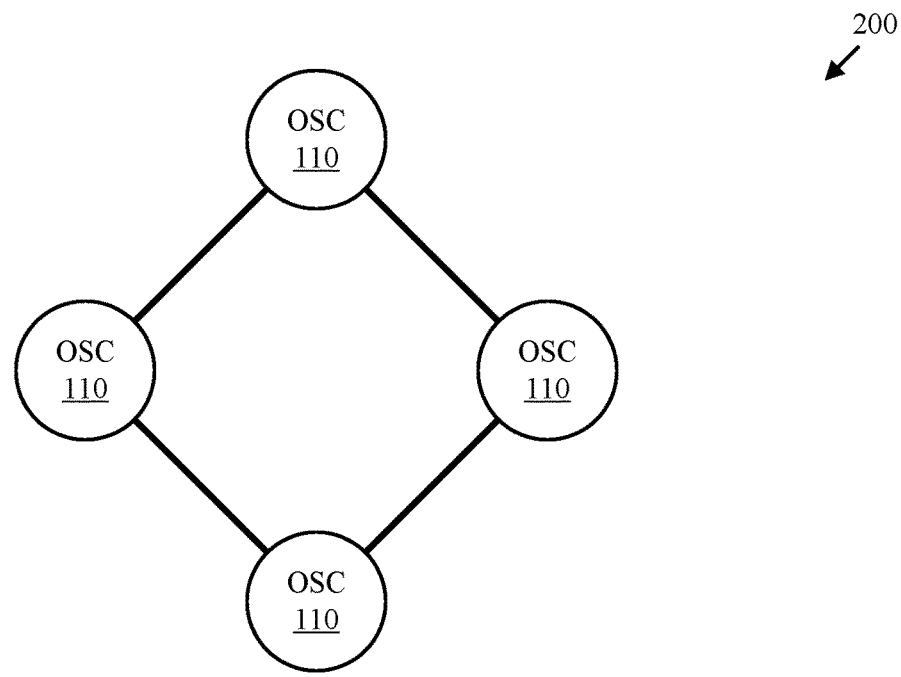
FIG. 2 is a block diagram depicting a directly coupled oscillation ring in accordance with at least one embodiment of the present invention.

The embodiments disclosed herein also recognize that directly coupled oscillators, such as those depicted in an oscillation ring 200 depicted in FIG. 2, behave essentially identical to coupled oscillators where the coupling networks 120 each comprise a coupling capacitor of infinite capacitance. Direct coupling may improve phase noise without requiring additional coupling elements.

Figure 3:
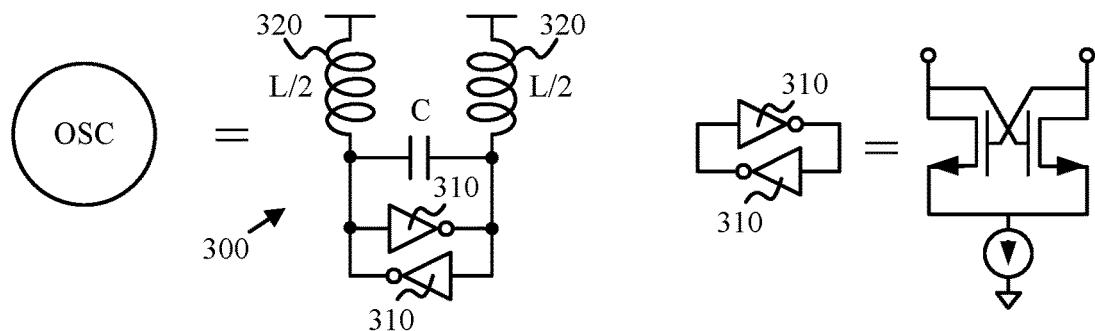
FIG. 3 is a schematic diagram depicting one example of a balanced LC oscillator in accordance with at least one embodiment of the present invention.

The embodiments disclosed herein also recognize that a balanced LC oscillator can be formed by splitting an inductor of inductance L into two halves of inductance L/2 that are connected in series with a capacitor of capacitance C. FIG. 3 depicts one example of such a balanced LC oscillator 300. To maintain oscillation, two inverting amplifiers 310 may be cross-coupled and place in parallel with the capacitor of capacitance C and in series with the split inductors 320. In the depicted embodiment, the pair of inverting amplifiers 310 comprise cross-coupled transistors (e.g., MOSFETs or BJTs) that each provide gain and approximately 180 degrees of phase inversion and drive the inductor and capacitor as a load impedance.

Figure 4:
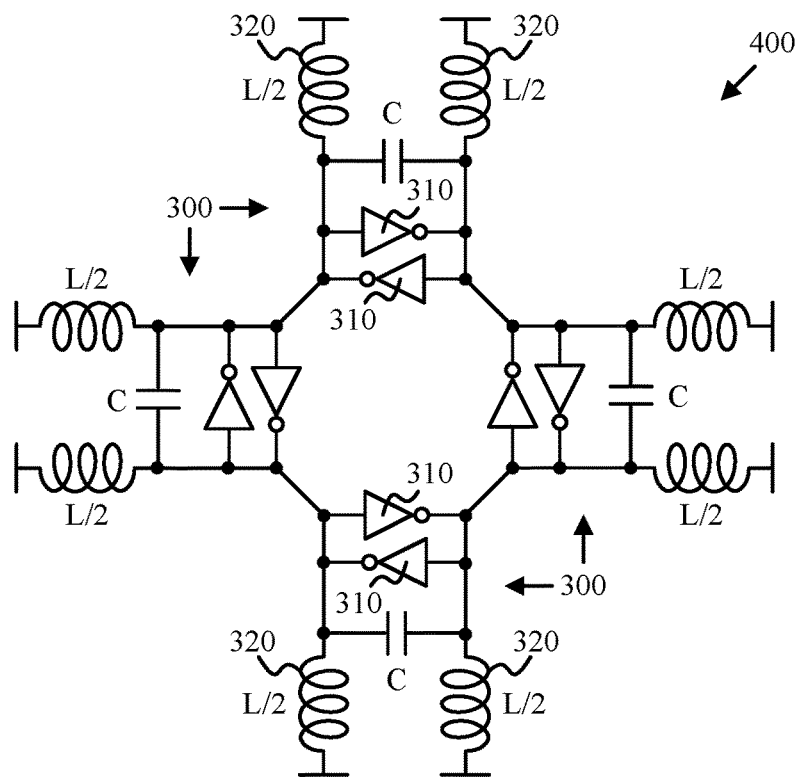
FIG. 4 is a schematic diagram depicting one example of a balanced oscillator ring in accordance with at least one embodiment of the present invention.

The embodiments disclosed herein also recognize that multiple balanced LC oscillators 300 may be directly coupled to form an oscillator ring such as the balanced oscillator ring 400 depicted in FIG. 4. The depicted balanced oscillator ring 400 has an even number of oscillators. Using an even number of oscillators may improve the steady state stability of the oscillator ring 400 over embodiments that have an odd number of oscillators.

Figure 5:
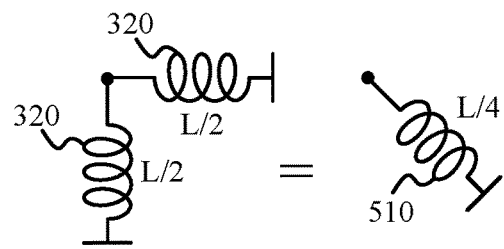
FIG. 5 is a schematic diagram depicting one example of an inductor substitution strategy in accordance with at least one embodiment of the present invention.

The embodiments disclosed herein also recognize that, as depicted in FIG. 5, two inductors 320 of inductance L/2 that are connected in parallel (e.g., to a power supply) can be replaced with a single inductor 510 of inductance L/4. Furthermore, by driving the single inductor with two adjacent inverting amplifiers the current through the single inductor 510 is doubled and an appropriate oscillation frequency is maintained. Consequently, the number of inductors and size of each inductor that are needed in a set of coupled oscillators (e.g., an oscillator ring) may be substantially reduced.

Figure 6:
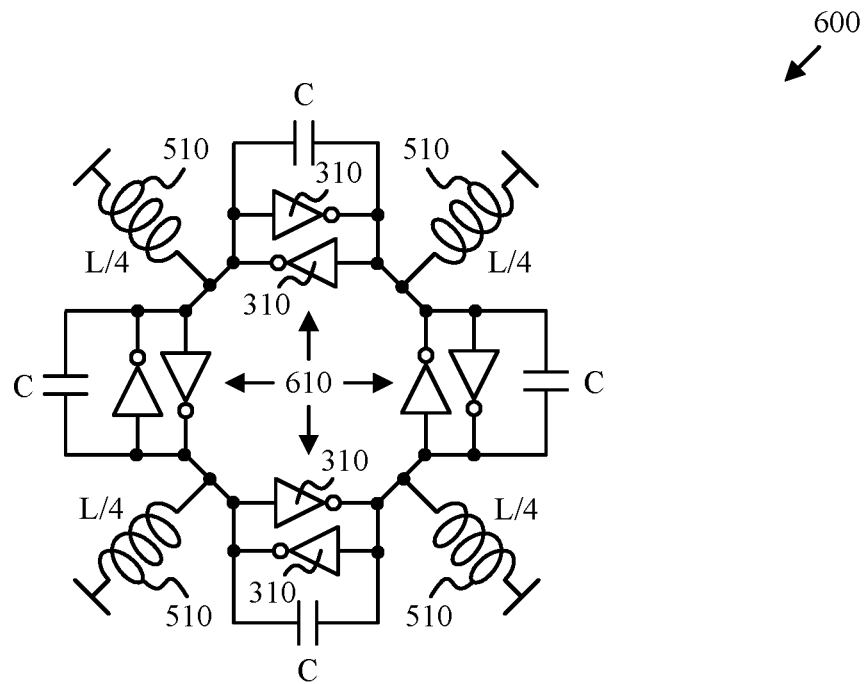
FIG. 6 is a schematic diagram depicting one example of a shared inductor oscillator ring in accordance with at least one embodiment of the present invention.
Figure 7:
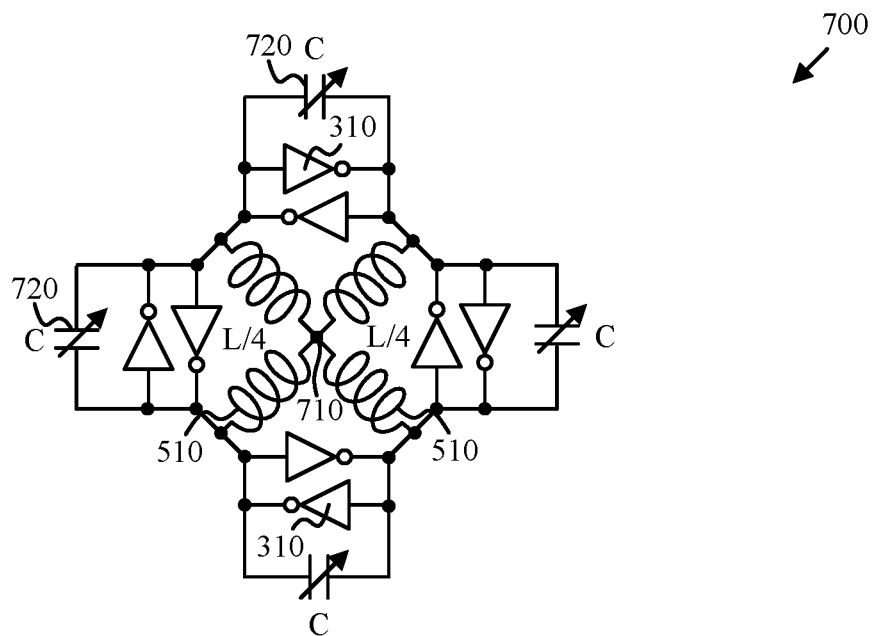
FIG. 7 is a schematic diagram depicting one example of a tunable oscillator ring in accordance with at least one embodiment of the present invention.

For example, as shown in FIG. 6, a shared inductor oscillator ring 600 may be formed from the balanced oscillator ring 400 by replacing pairs of inductors 320 of inductance L/2 corresponding to adjacent oscillators with single inductors 510 of inductance L/4. Additionally, the inductors 510 of inductance L/4 may be folded into the center region of the circuit and electrically coupled to a common node 710 in a star configuration as shown in FIG. 7. The star configuration may enable a compact layout on an integrated circuit or the like (see FIGS. 10A and 10B). Furthermore, the capacitors of capacitance C may be tunable capacitors 720 that facilitate tuning the center frequency of the oscillator ring to provide the tunable oscillator ring 700 depicted in FIG. 7. Power may be provided to the cross-coupled amplifiers 310 to initiate oscillation of the tunable oscillator ring 700. In some embodiments, power is also provided to the common node 710 (assumed but not shown in the depicted embodiment).

Figure 8:
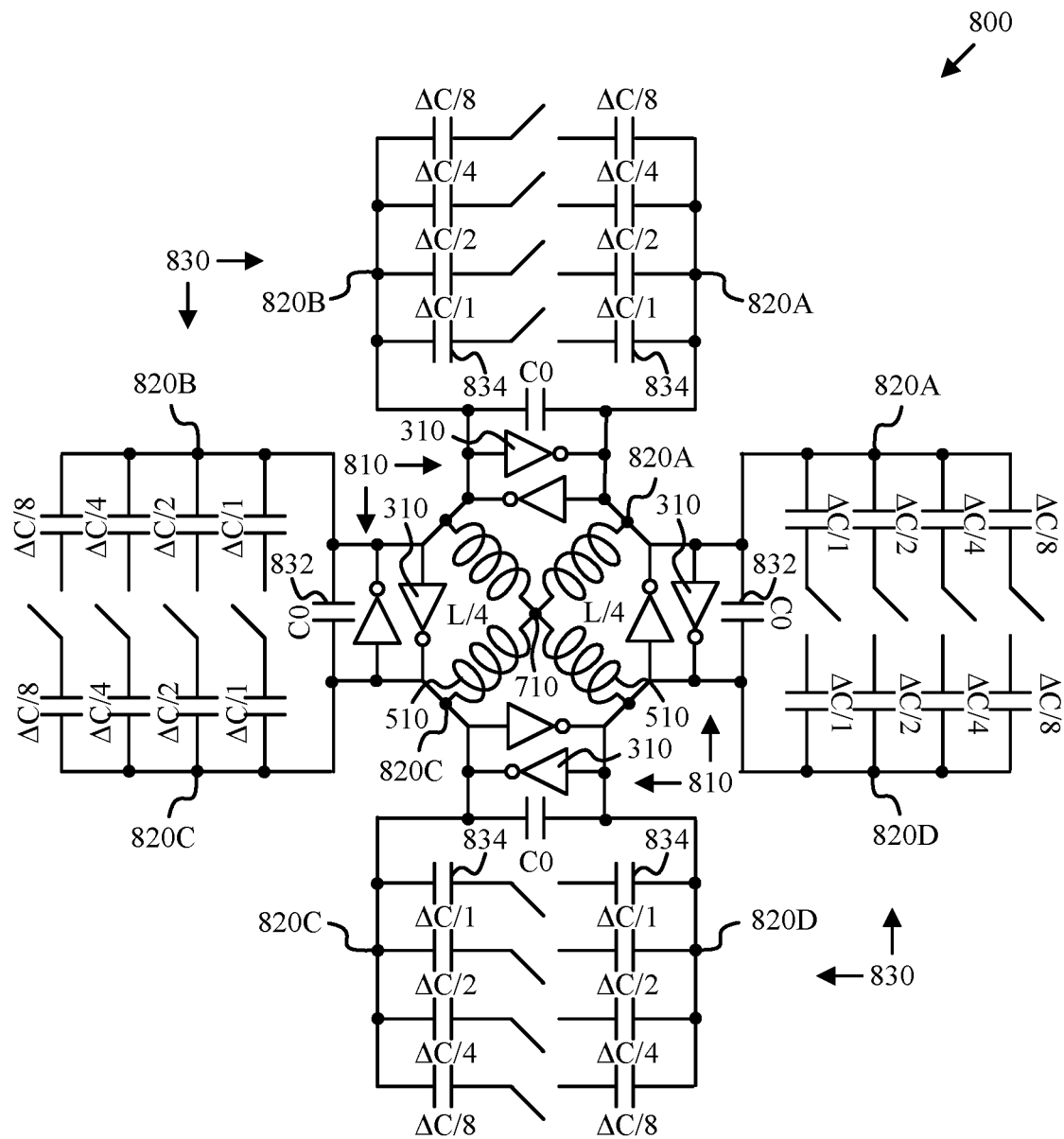
FIG. 8 is a schematic diagram depicting one example of a discretely tunable oscillator ring in accordance with at least one embodiment of the present invention.

FIG. 8 is a schematic diagram depicting one example of a discretely tunable oscillator ring 800 in accordance with at least one embodiment of the present invention. As depicted, the discretely tunable oscillator ring 800 includes N discretely tunable oscillators 810, where N is an even integer that is greater than 3, that are connected in series in a loop by N connection nodes 820, each oscillator of the N oscillators comprising a pair of cross-coupled inverting amplifiers 310. In the depicted embodiment, N is equal to four and there are four discretely tunable oscillators 810 and four connections nodes 820 (i.e., 820A-820D).

The discretely tunable oscillator ring 800 also includes N shared inductors 510 of inductance L/4 arranged in a star configuration such that each inductor of the N shared inductors 510 connects to a corresponding connection node 820 of the oscillation ring 800 as well as the common connection node 710. Depending on the operational characteristics of the cross-coupled inverting amplifiers 310, the common connection node 710 may be connected to a voltage source (not shown but assumed) or the like, or the common connection node 710 may be a floating node or grounded node.

Each discretely tunable oscillator 810 also includes a capacitor bank 830 connected in parallel with the cross-coupled inverting amplifiers 310 corresponding to the oscillator 810. In the depicted embodiment, each capacitor bank 830 includes a base capacitor 832 with capacitance C0 and incremental capacitor pairs 834 with capacitance $\Delta C/(2^n)$ where ranges from 1 to 4. In the depicted embodiment, the capacitance of the base capacitor 832 corresponds to the maximum desired frequency of the discretely tunable oscillator ring 800 e.g., $\omega_{max}=1/\sqrt{(L \cdot C0)}$. In some embodiments, the base capacitance is provide partially or wholly by parasitic capacitance in the components of the oscillators 810.

The incremental capacitor pairs 834 are pairs of capacitive elements of substantially equal value that are arranged in series with activation switches 836. Consequently, the activation switches 836 correspond to a virtual ground point between the capacitive elements when the oscillator ring 800 oscillates. By activating the activation switches 836, the capacitance of each capacitor bank 830 may be increased and the oscillation frequency of the individual oscillators 810 and the oscillator ring 800 as a whole, may be reduced. For example, in the depicted embodiment the oscillation frequency may be discretely adjusted over 64 values (and not just 16 values) between $\omega_{min}$ and $\omega_{max}$ where $\omega_{min} \approx 1/\sqrt{[L \cdot (C0+\Delta C)]}$ and $\omega_{max} \approx 1/\sqrt{(L \cdot C0)}$. For the minimum capacitance and switch size given by a process technology, this coupling-by-four scheme improves the frequency tuning resolution by four times compared to a single oscillator case.

Figure 9:
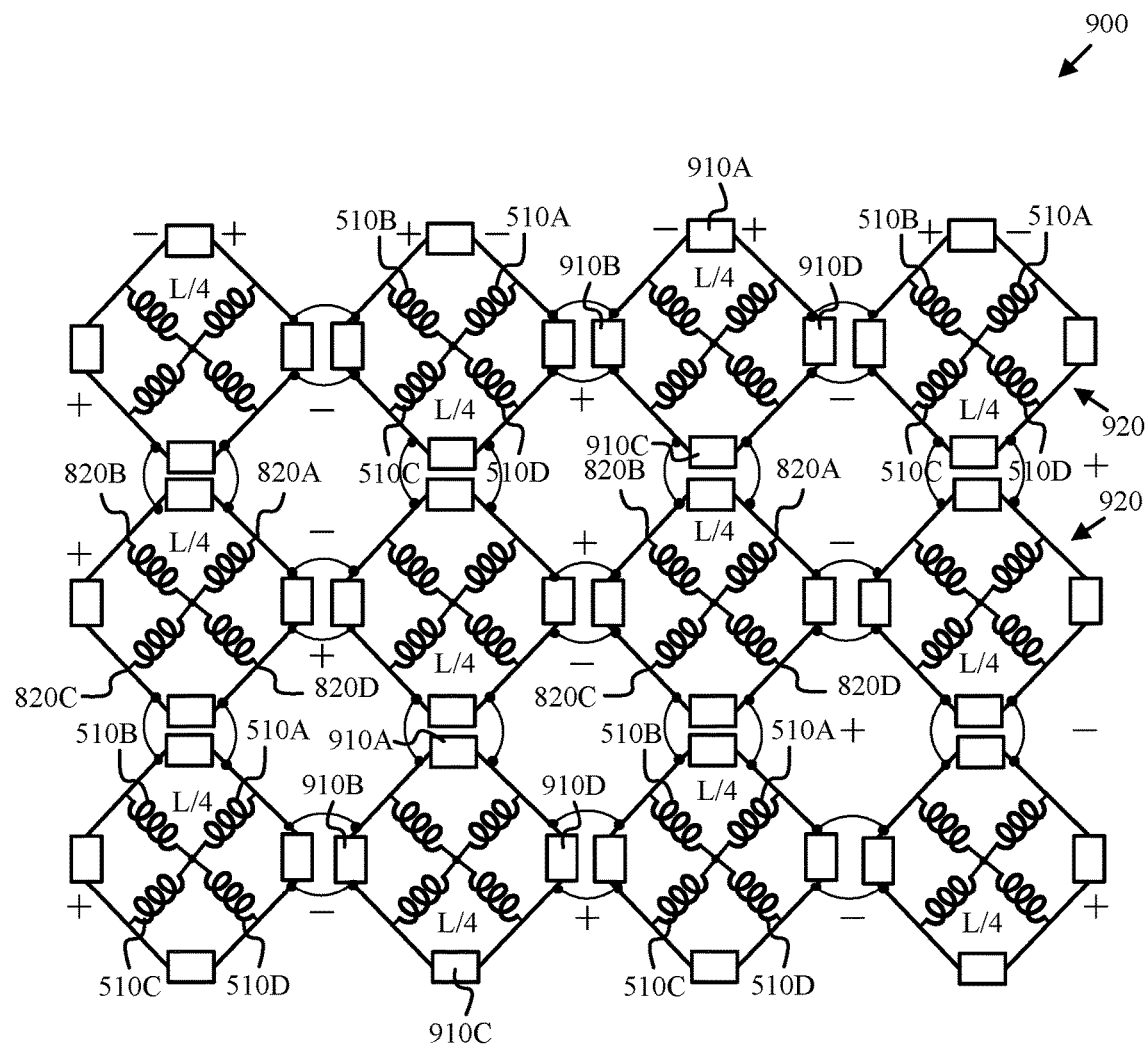
FIG. 9 is a schematic block diagram depicting one example of a coupled oscillator array in accordance with at least one embodiment of the present invention.

FIG. 9 is a schematic block diagram depicting one example of a coupled oscillator array 900 in accordance with at least one embodiment of the present invention. For the purpose of clarity, the capacitors and inverting amplifiers shown in previous drawings are collectively represented as oscillation elements 910. During oscillation each end of the oscillation elements 910 will oscillate with opposite polarity as shown by the polarity symbols "+" and "−".

One of skill in the art will appreciate that the coupled oscillator array 900 essentially comprises multiple oscillator rings 920 that are coupled together (interconnected) at multiple connection nodes 820 (e.g., two) to form a 2-D array. In the depicted arrangement, adjacent rings 920 have separate oscillation elements 910 that are connected in parallel. In another embodiment, the oscillation elements 910 (e.g., cross-coupled inverting amplifiers) are shared between adjacent rings 920.

Each oscillation ring 920 has even number of oscillation elements 910 connected in a loop. Consequently, the polarity inversions provided by the even number of oscillation elements 910 cancel out and oscillation elements that connect to each other via the connection nodes 820 have a common polarity and will tend to oscillate in phase with each other. In the depicted embodiment, connection nodes 820A and 820C have a negative polarity while connection nodes 820B and 820D have a positive polarity.

Figure 10A:
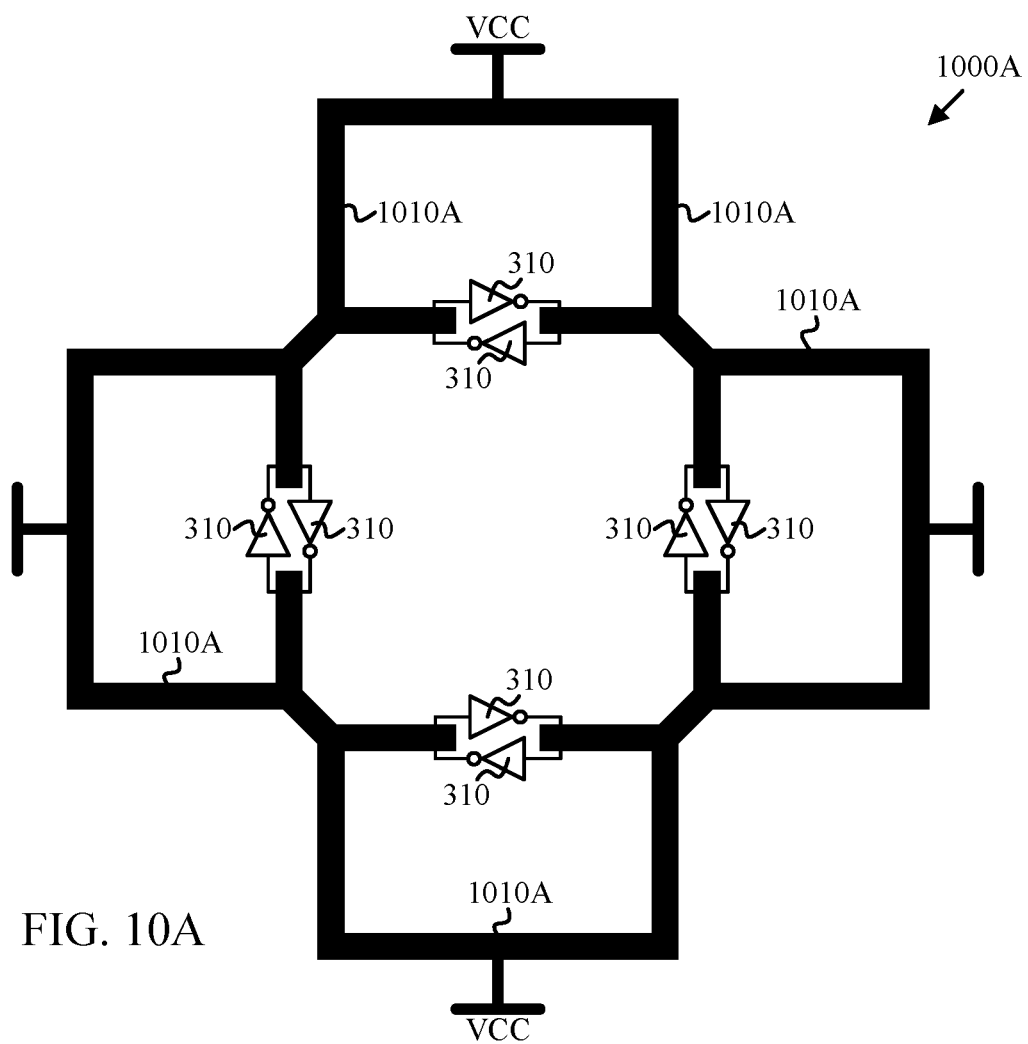
FIGS. 10A and 10B are schematic layout diagrams depicting two examples of a shared inductor oscillator ring in accordance with at least one embodiment of the present invention.
Figure 10B:
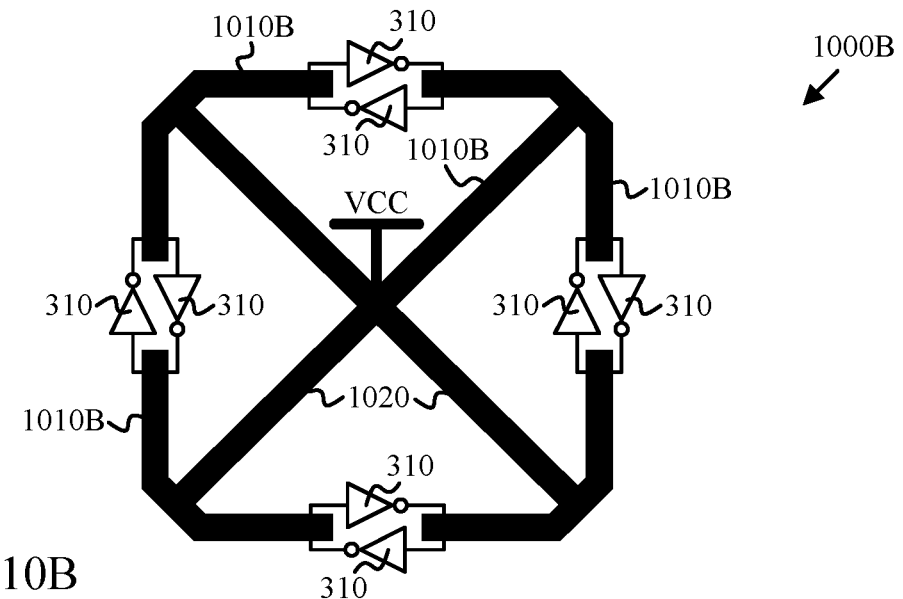

FIGS. 10A and 10B are schematic layout diagrams depicting two examples of a shared inductor oscillator ring 1000 in accordance with at least one embodiment of the present invention. FIGS. 10A and 10B include schematic elements (e.g., the inverting amplifiers 310) as well as plan view layout elements such as inductor loops 1010, and shared legs 1020. As shown in FIG. 10A a shared inductor oscillator ring 1000A with a non-star configuration may require significantly more layout area than a shared inductor oscillator ring 1000A with a star configuration shown in FIG. 10B.

One of skill in the art will appreciate that at least some of the embodiments disclosed herein are robust to the frequency mismatch of individual oscillators and improve oscillator phase noise while reducing the footprint consumed by inductors. It should also be noted that this description is not intended to limit the invention. On the contrary, the embodiments presented are intended to cover some of the alternatives, modifications, and equivalents, which are included in the spirit and scope of the invention as defined by the appended claims. Further, in the detailed description of the disclosed embodiments, numerous specific details are set forth in order to provide a comprehensive understanding of the claimed invention. However, one skilled in the art would understand that various embodiments may be practiced without such specific details.

Although the features and elements of the embodiments disclosed herein are described in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. An apparatus comprising:
    a first oscillation ring comprising exactly N oscillators, where N is an even integer that is greater than 3, the N oscillators connected in series in a loop by N connection nodes, each oscillator of the N oscillators comprising a pair of cross-coupled inverting amplifiers;
    exactly N inductors physically arranged in a star configuration such that a first end of each inductor of the N inductors connects to a corresponding one of the N connection nodes of the first oscillation ring and a second end of each inductor connects to a common node within an interior region of the first oscillation ring.

2. The apparatus of claim 1, wherein at least one pair of cross-coupled inverting amplifiers comprises a pair of cross-coupled transistors.

3. The apparatus of claim 1, further comprising a second oscillation ring connected to the first oscillation ring at a plurality of the N connection nodes.

4. The apparatus of claim 3, wherein a pair of cross-coupled inverting amplifiers from the first oscillation ring and a pair of cross-coupled inverting amplifiers from the second oscillation ring are connected in parallel to each other.

5. The apparatus of claim 3, wherein a pair of cross-coupled inverting amplifiers is shared by the first oscillation ring and the second oscillation ring.

6. The apparatus of claim 3, wherein the first oscillation ring and the second oscillation ring are members of a 2-D array of oscillation rings.

7. The apparatus of claim 3, wherein the first oscillation ring and the second oscillation ring are members of a ring of oscillation rings.

8. The apparatus of claim 1, further comprising N capacitors, each of the N capacitors connected in parallel with a corresponding pair of cross-coupled inverting amplifiers.

9. The apparatus of claim 8, wherein each of the N capacitors corresponds to an oscillator of the N oscillators.

10. The apparatus of claim 1, further comprising N capacitor banks, each of the N capacitor banks corresponding to an oscillator of the N oscillators and connected in parallel with a corresponding pair of cross-coupled inverting amplifiers.

11. The apparatus of claim 10, wherein a capacitor bank of the N capacitor banks comprises a plurality of activation switches for loading the first oscillation ring with capacitance.

12. The apparatus of claim 11, wherein each activation switch corresponds to a virtual ground between two capacitive elements of substantially equal value.

13. The apparatus of claim 1, wherein each of the N inductors also connect to common connection node.

14. The apparatus of claim 13, wherein the common connection node corresponds to a supply voltage.

15. A method comprising:
    providing an oscillation ring comprising exactly N oscillators, where N is an even integer that is greater than 3, the N oscillators connected in series in a loop by N connection nodes, each oscillator of the N oscillators comprising a pair of cross-coupled inverting amplifiers;
    providing exactly N inductors arranged in a star configuration such that a first end of each inductor of the N inductors connects to a corresponding one of the N connection nodes of the oscillation ring and a second end of each inductor connects to a common connection node of the star disposed within an interior region of the first oscillation ring; and
    providing power to cross-coupled inverting amplifiers within the oscillation ring.

16. The method of claim 15, further comprising providing N capacitor banks, each of the N capacitor banks corresponding to an oscillator of the N oscillators and connected in parallel with a corresponding pair of cross-coupled inverting amplifiers.

17. The method of claim 16, wherein a capacitor bank of the N capacitor banks comprises a plurality of activation switches for loading oscillation ring with capacitance.

18. The method of claim 17, wherein each activation switch corresponds to a virtual ground between two capacitive elements of substantially equal value.

19. The method of claim 18, further comprising activating selected activation switches to adjust an oscillation frequency for the oscillation ring toward a desired value.

20. An apparatus comprising:
    a plurality of oscillation rings that are interconnected to form a 2D array of oscillators;
    each oscillation ring comprising an even number of at least four oscillators connected in series in a loop by corresponding number of connection nodes, each oscillator of the plurality of oscillation rings comprising a pair of cross-coupled inverting amplifiers;
    wherein each of the corresponding connection nodes is also connected to a first end of a corresponding inductor and a second end of each corresponding inductor is connected to a common node disposed within an interior portion of an oscillation ring.

* * * * *